(12) United States Patent
Yen

(10) Patent No.: US 6,501,307 B1
(45) Date of Patent: Dec. 31, 2002

(54) SPREAD-SPECTRUM CLOCK BUFFER/DRIVER THAT MODULATES CLOCK PERIOD BY SWITCHING LOADS

(75) Inventor: Yao Tung Yen, Cupertino, CA (US)

(73) Assignee: Pericom Semiconductor Corp., San Jose, CA (US)

(*) Notice: Subject to any disclaimer, the term of this patent is extended or adjusted under 35 U.S.C. 154(b) by 0 days.

(21) Appl. No.: 09/683,041

(22) Filed: Nov. 12, 2001

(51) Int. Cl.[7] .............................................. H03B 19/00
(52) U.S. Cl. ........................ 327/113; 327/114; 327/175
(58) Field of Search ................................ 327/261, 262, 327/263, 264, 276, 277, 278, 281, 113, 114, 172, 175, 173, 174, 176; 377/47, 48

(56) References Cited

U.S. PATENT DOCUMENTS

| | | | |
|---|---|---|---|
| 3,833,854 A | 9/1974 | Schonover ................. 328/155 |
| 3,916,329 A | 10/1975 | Hekimian et al. .......... 328/155 |
| 4,507,796 A | 3/1985 | Stumfall ..................... 375/106 |
| 4,868,522 A | 9/1989 | Popat et al. .................... 331/2 |
| 4,916,411 A | 4/1990 | Lymer .......................... 331/25 |
| 5,113,152 A | 5/1992 | Norimatsu .................... 331/11 |
| 5,118,975 A | 6/1992 | Hillis et al. ................. 307/602 |
| 5,426,392 A | 6/1995 | Kornfeld ..................... 327/551 |
| 5,467,041 A | 11/1995 | Baba et al. .................. 327/276 |
| 5,479,129 A | 12/1995 | Fernandez et al. .......... 327/276 |
| 5,565,816 A | 10/1996 | Coteus ........................... 331/2 |
| 5,631,920 A | 5/1997 | Hardin ........................ 375/200 |
| 5,675,832 A | 10/1997 | Ikami et al. ................. 395/835 |
| 5,736,893 A | 4/1998 | Puckette et al. ............. 327/551 |
| 5,742,832 A | 4/1998 | Buxton et al. ............... 395/750 |
| 5,767,719 A * | 6/1998 | Furuchi et al. .............. 327/281 |
| 5,943,382 A | 8/1999 | Li et al. ....................... 375/376 |
| 6,046,735 A | 2/2000 | Bassetti et al. ............. 345/204 |
| 6,144,242 A | 11/2000 | Jeong et al. ................. 327/269 |
| 6,148,020 A | 11/2000 | Emi ............................ 375/132 |
| 6,160,839 A | 12/2000 | Zhang ......................... 375/130 |
| 6,294,936 B1 | 9/2001 | Clementi .................... 327/156 |

FOREIGN PATENT DOCUMENTS

| | | | |
|---|---|---|---|
| JP | 61-237512 | * 10/1986 | ................ 327/261 |
| JP | 4-340807 | * 11/1992 | ................ 327/261 |

* cited by examiner

*Primary Examiner*—Tuan T. Lam
(74) *Attorney, Agent, or Firm*—Stuart T. Auvinen

(57) ABSTRACT

A clock modulator spreads the frequency spectrum of an input clock to generate an output clock. A capacitor is connected to an intermediate clock node by a load-switching transistor. When the transistor is turned on, the capacitor increases the loading on the intermediate clock node, increasing delay. When the transistor is turned off, the delay is reduced. Output clock cycle periods are extended when delay is added, and reduced when the transistor turns off. A counter or sequencer is clocked by the input clock and drives the load-switching transistor. The transistor is turned on and off for alternate cycles when the counter is a toggle flip-flop, spreading the frequency over two frequencies every two clock cycles. Two capacitors of different sizes, connected to the intermediate clock node by two transistors, can be switched by a 2-bit sequencer, spreading the output clock over 7 frequencies every 7 clock cycles.

20 Claims, 7 Drawing Sheets

| Clock Number | Load Enabled? | Clock Period Extended or Reduced by | Resulting Period Time | Frequency Change (%) |
|---|---|---|---|---|
| FCLK | | 0 | 10.000 ns | |
| 1 | Yes | + 25 ps | 10.025 ns | - 0.25 % |
| 2 | No | - 25 ps | 9.975 ns | + 0.25 % |
| 3 | Yes | + 25 ps | 10.025 ns | - 0.25 % |
| 4 | No | - 25 ps | 9.975 ns | + 0.25 % |
| 5 | Yes | + 25 ps | 10.025 ns | - 0.25 % |
| 6 | No | - 25 ps | 9.975 ns | + 0.25 % |
| 7 | Yes | +25 ps | 10.025 ns | - 0.25 % |

FIG. 5C

| Clock Number | Load Enabled? | Clock Period Extended or Reduced by | Resulting Period Time | Frequency Change (%) |
|---|---|---|---|---|
| Start | No | 0 | 10.000 ns | |
| 1 | Yes | + 25 ps | 10.025 ns | - 0.25 % |
| 2 | Yes | 0 | 10.000 ns | 0 |
| 3 | No | - 25 ps | 9.975 ns | + 0.25 % |
| 4 | No | 0 | 10.000 ns | 0 |
| 5 | Yes | + 25 ps | 10.025 ns | - 0.25 % |
| 6 | Yes | 0 | 10.000 ns | 0 |
| 7 | No | - 25 ps | 9.975 ns | + 0.25 % |
| 8 | No | 0 | 10.000 ns | 0 |

FIG. 6C

| Clock Number | Load (1,2) Control | Clock Period Extended or Reduced by | Resulting Period Time | Frequency Change (%) |
|---|---|---|---|---|
| Start | (0,0) | 0 | 10.000 ns | |
| 1 | (1,0) | + 12 ps | 10.012 ns | - 0.12 % |
| 2 | (1,1) | + 12 ps | 10.012 ns | - 0.12 % |
| 3 | (1,1) | 0 | 10.000 ns | 0 |
| 4 | (0,1) | - 12 ps | 9.988 ns | + 0.12 % |
| 5 | (0,0) | - 12 ps | 9.988 ns | + 0.12 % |
| 6 | (0,0) | 0 | 10.000 ns | 0 |
| 7 | (1,0) | + 12 ps | 10.012 ns | - 0.12 % |
| 8 | (1,1) | + 12 ps | 10.012 ns | - 0.12 % |

FIG. 7C

| Clock Number | Load (1,2) Control | Clock Period Extended or Reduced by | Resulting Period Time | Frequency Change (%) |
|---|---|---|---|---|
| Start | (0,0) | 0 | 10.000 ns | |
| 1 | (1,0) | + 17 ps | 10.017 ns | - 0.17 % |
| 2 | (0,0) | - 17 ps | 9.983 ns | + 0.17 % |
| 3 | (0,1) | + 8 ps | 10.008 ns | - 0.08 % |
| 4 | (0,0) | - 8 ps | 9.992 ns | + 0.08 % |
| 5 | (1,1) | + 25 ps | 10.025 ns | - 0.25 % |
| 6 | (1,1) | 0 | 10.000 ns | 0 |
| 7 | (0,0) | - 25 ps | 9.975 ns | + 0.25 % |

FIG. 8

SPREAD-SPECTRUM CLOCK BUFFER/DRIVER THAT MODULATES CLOCK PERIOD BY SWITCHING LOADS

BACKGROUND OF INVENTION

This invention relates to integrated circuits, and more particularly to clock buffers and drivers with reduced EMI.

Electronic devices and equipment can often generate interference that creates disturbances in other electronic equipment. For example, a portable computer may emit radiation that interferes with a television receiver. Intentional receivers, such as televisions, cellular phones, pagers, and wireless devices, are often affected by unintentional transmitters that emit electromagnetic radiation. As both types of electronic equipment become more common, interference becomes more noticeable to the consumer.

Electromagnetic interference (EMI) is a measure of the amount of interference that an electronic device (the unintentional transmitter) disturbs an intentional receiver. Government agencies such as the Federal Communication Commission (FCC) strictly regulate the amount of radiation or EMI that an electronic device can generate. Portable devices such as portable personal computers (PC's) are particularly problematic since these portable devices are easily placed near televisions or other receivers. Cramped office and living spaces often force electronic equipment closer together. Since radiation rapidly increases with smaller distances, smaller and more portable equipment often appear to generate more interference.

Improving technology also worsens the EMI problem. Faster clock rates of higher-speed PC's generate more radiation. Higher communication rates require that more data bits be transferred in a time period; a higher clock rate and more interference results.

A technique to reduce peak EMI is to vary or modulate the frequency of clocks in the electronic device. This technique known as spread spectrum, since the frequency spectrum of the clock is spread out over a wider range of frequencies. Phase-locked loops (PLL's) have been developed that vary the control voltage to a voltage-controlled oscillator (VCO), or vary a feedback divisor to modulate the frequency generated. Unfortunately, noise and tracking can be a problem, especially when a clock generator and multiple clock buffer drivers are cascaded.

Another approach to reducing EMI is to insert controllable delays in parallel signal paths. See for example U.S. Pat. No. 6,144,242 by jeong et al., and U.S. Pat. No. 5,675,832 by Ikami et al. This technique is useful for staggering delays among signal lines in a wide data bus so that all signals do not have coincident edges.

BRIEF DESCRIPTION OF DRAWINGS

FIG. 5C is a table highlighting the clock modulation of FIGS. 5A,B that occurs over two cycles.

FIG. 6C is a table highlighting clock modulation over four cycles produced by the clock modulator of FIG. 6A.

FIG. 7C is a table showing the six-clock modulation cycle of the dual-load clock modulator of FIG. 7A.

FIG. 8 is a table for operation of the clock modulator of FIG. 7A when capacitors 28, 38 have different capacitance values.

DETAILED DESCRIPTION

The present invention relates to an improvement in reduced-EMI clock buffer/drivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
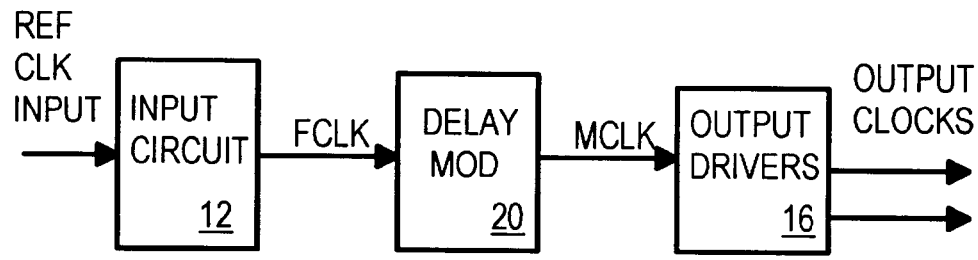
FIG. 1 is a block diagram of a non-PLL based reduced-EMI clock buffer/driver using a delay modulator.

FIG. 1 is a block diagram of a non-PLL-based reduced-EMI clock buffer/driver using a delay modulator. A reference clock is input to input circuit 12, which buffers the reference clock to generate fixed clock FCLK. The frequency of FCLK is fixed or stable. Such a fixed-frequency clock could generate an unacceptable amount of EMI.

Delay modulator 20 received FCLK and generates modulated clock MCLK by delaying clock edges. The amount of the delay is changed or modulated to cause the frequency of MCLK to vary or be modulated. This modulation of the clock frequency reduces the EMI at a primary frequency by spreading the emissions over a range of frequencies. Output drivers 16 buffer MCLK to generate one or more output clock. Output drivers 16 can include branching logic to generate multiple copies of MCLK that drive different parts of a system, such as a memory clock to a clocked DRAM and a processor clock to a microprocessor that are both based on the same reference clock.

Figure 2:
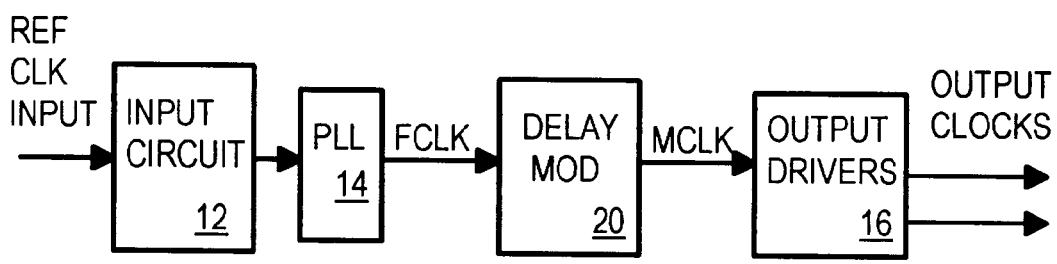
FIG. 2 is a diagram of a PLL-based reduced-EMI clock buffer/driver using a delay modulator.

FIG. 2 is a diagram of a PLL-based reduced-EMI clock buffer/driver using a delay modulator. A reference clock is input to input circuit 12, which buffers the reference clock to drive a reference input of Phase-locked loop (PLL) 14. PLL 14 has a feedback clock that is phase-compared to the input reference clock from input circuit 12. The result of the phase comparisons alter the frequency of the output and feedback clock or clocks.

PLL 14 generates fixed clock FCLK as its output clock. The frequency of FCLK is fixed or stable. Delay modulator 20 received FCLK from PLL 14 and generates modulated clock MCLK by delaying clock edges. The amount of the delay is changed or modulated to cause the frequency of MCLK to vary or be modulated. EMI is reduced by the modulation of the clock frequency. Output drivers 16 buffer MCLK to generate one or more output clock. Output drivers 16 can include branching logic to generate multiple copies of MCLK that drive different parts of a system, such as a memory clock to a clocked DRAM and a processor clock to a microprocessor that are both based on the same reference clock.

Figure 3:
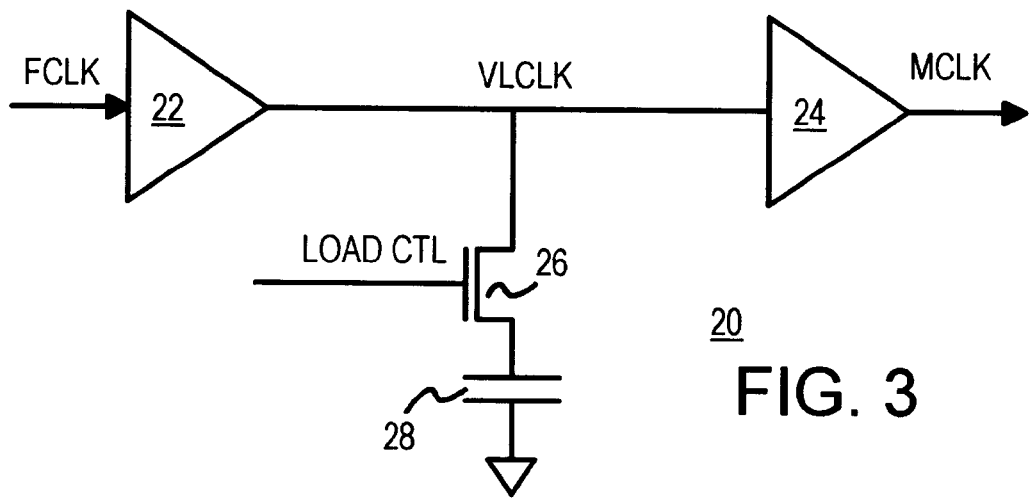
FIG. 3 shows a clock modulator that varies clock delay by switching a clock internal load.

FIG. 3 shows a clock modulator that varies clock delay by switching a clock load. Clock modulator 20 can be implemented by switching a load on the clock. When the load is attached to the clock, the clock is slower and more delayed than when the load is not attached to the clock.

Fixed-frequency clock FCLK is buffered by buffer 22 to drive variable-load clock VLCLK. The load on VLCLK is switched on and off at a high rate, causing the delay of VLCLK to vary from clock-cycle to clock-cycle. Some clock edges are delayed, extending a clock period, while other clock edges are not delayed, shortening a clock period. The resulting modulation of the clock period causes the frequency of VLCLK to be modulated.

Capacitor 28 is coupled to VLCLK when load-switching transistor 26 is on, but is disconnected from VLCLK when transistor 26 is off. In this embodiment, transistor 26 is an n-channel transistor with a gate controlled by a load control signal LOAD_CTL. When LOAD_CTL is driven high, transistor 26 turns on, connecting capacitor 28 to VLCLK. Then buffer 22 has to charge and discharge capacitor 28. The added capacitance of capacitor 28 causes the rise and fall times of VLCLK to be increase. The slower transitions of VLCLK cause the logic thresholds of buffer 24 to be reached at a later time, causing buffer 24 to change the logic state or transition MCLK later in time. Thus the clock switching is delayed when transistor 26 is on and capacitor 28 is attached to VLCLK.

When LOAD_CTL is low, transistor 26 is turned off. Capacitor 28 is disconnected from VLCLK. The lower capacitance on VLCLK allows buffer 22 to more quickly drive VLCLK as buffer 22 only has to charge and discharge the input capacitance of buffer 24, and the parasitic capacitances of VLCLK such as the wiring capacitances. VLCLK has a faster rise and fall time, allowing the logic thresholds of buffer 24 to be reached more quickly. Buffer 24 then transitions its output MCLK at an earlier time than when transistor 26 is turned on.

Figure 4:
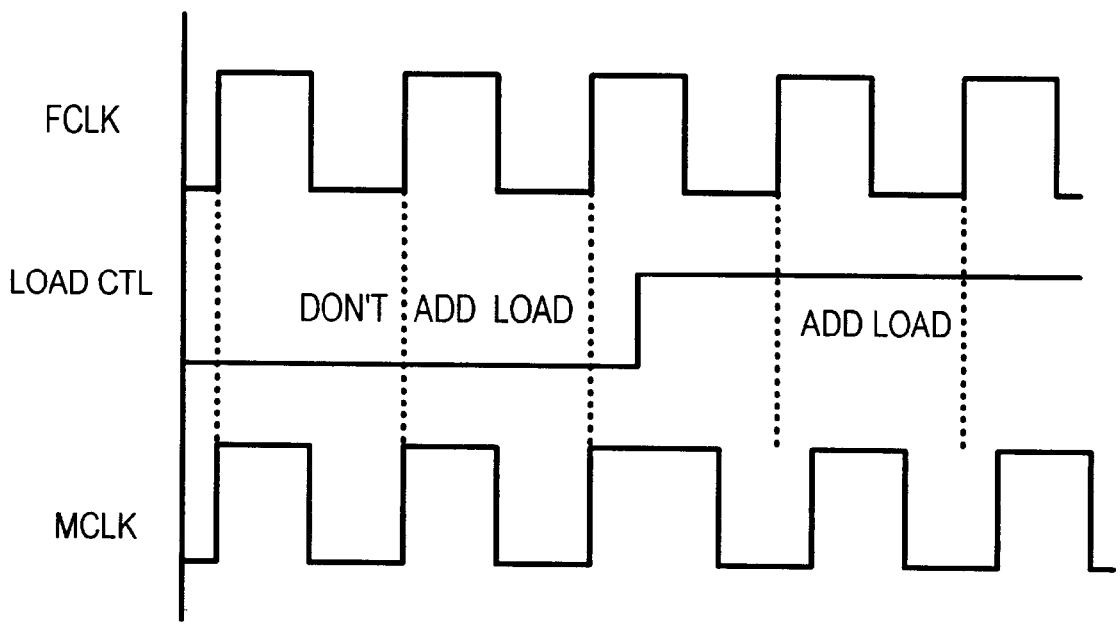
FIG. 4 is a waveform that illustrates switching the internal capacitive load in the clock modulator.

FIG. 4 is a waveform that illustrates switching the capacitive load in the clock modulator. The fixed clock FCLK has a relatively fixed frequency that varies only slightly and slowly, perhaps due to slow changes in temperature and supply voltage. The gate of transistor 26 is controlled by control signal LOAD_CTL, which in this example is low for the first two clock periods of FCLK, but is then switched high for the last three clock periods of FCLK.

For the first two clock periods when LOAD_CTL is low, the modulated clock MCLK has little added delay and its edges closely follow the clock edges of FCLK. The clock period of MCLK is the same as the period of FCLK.

During the third clock period of FCLK, LOAD_CTL is switched high before the falling edge of FCLK. The falling edge of MCLK, which is generated from the falling edge of FCLK, is then delayed by the added capacitance of capacitor 28. The high portion of the third period of MCLK is stretched out since the rising edge was not delayed (it was before LOAD_CTL was switched), while the falling edge was delayed (it occurred after LOAD_CTL was switched).

The remaining rising and falling edges of MCLK are delayed from the rising and falling edges of FCLK due to the added load. The third period of MCLK is enlarged due to the delay of the falling edge after LOAD_CTL switched on. However, the remaining fourth and fifth periods of MCLK are the same as the period of FCLK. The only period of MCLK that was stretched was the third period, when LOAD_CTL was switched on.

The clock period is modulated when the load control signal LOAD_CTL is switched on or off. More rapid modulation of the clock frequency can be accomplished by switching LOAD_CTL at a high rate.

Figure 5A:
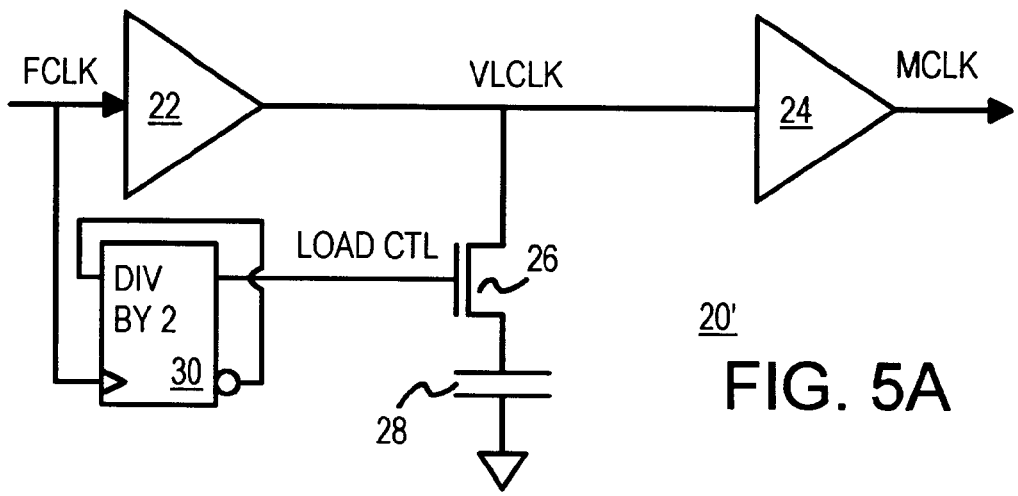
FIG. 5A shows a clock modulator that rapidly switches a capacitive clock load each clock cycle.

FIG. 5A shows a clock modulator that rapidly switches a capacitive clock load each clock cycle. Toggle flip-flop 30 is clocked by fixed clock FCLK that is also input to buffer 22. Each rising edge of FCLK causes toggle flip-flop 30 to change the state of LOAD_CTL. Thus transistor 26 is switched on and off during alternate cycles of FCLK.

Capacitor 28 is connected to VLCLK every other clock cycle. The rise and fall times of VLCLK are delayed when capacitor 28 is connected to VLCLK by transistor 26. Buffer 24 delays transitions of MCLK when transistor 26 connects capacitor 28. Clock modulator 20' thus rapidly modulated clock cycles.

Figure 5B:
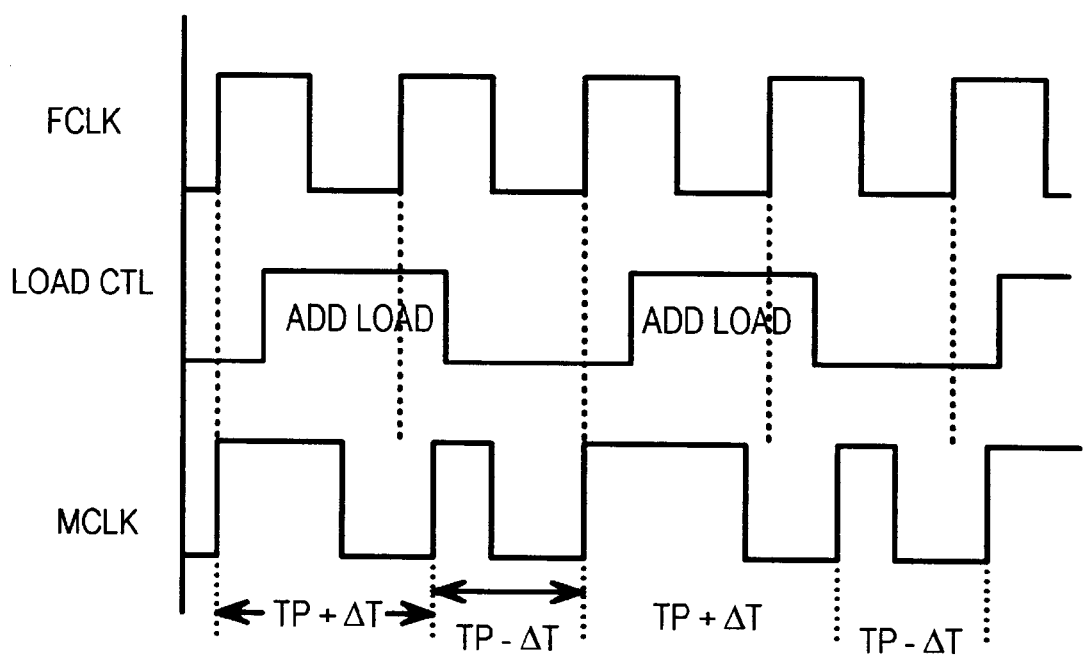
FIG. 5B is a waveform of the clock modulator of FIG. 5A that toggles the load-switching transistor each clock cycle.

FIG. 5B is a waveform of the clock modulator of FIG. 5A that toggles the load-switching transistor each clock cycle. Each rising edge of FCLK toggles the flip-flop that generates LOAD_CTL. The load capacitor is added for the first and third clock cycles, but not added for the second and fourth clock cycles. There is a propagation delay from the rising edge of FCLK through toggle flip-flop 30 before LOAD_CTL is switched. LOAD_CTL switches after the rising edge of FCLK.

In the first clock cycle, the rising edge of FCLK is not delayed, since LOAD_CTL is low and the capacitor is not connected. The first rising edge of MCLK is generated with little delay from FCLK. However, LOAD_CTL is high when the first falling edge of FCLK occurs, so the first falling edge of MCLK is delayed by the added capacitance. When the next rising edge of FCLK occurs at the end of the first cycle, LOAD_CTL is still high, so the rising edge of MCLK is delayed. The high pulse width of the first cycle of MCLK is extended but the low pulse width is not. The period of the first cycle of MCLK is the nominal period TP plus an added delay ΔT caused by the extended high pulse-width. Thus the first period of MCLK is extended to TP+ΔT.

The second clock period starts with a delayed rising edge of MCLK, since LOAD_CTL is initially on. However, LOAD_CTL is switched low before the falling edge of FCLK occurs, so the falling edge of MCLK is generated more quickly, with little delay from FCLK. At the end of the second period, LOAD_CTL is still low, so the rising edge of MCLK is generated with little delay from FCLK. The high pulse width of the second period of MCLK is reduced, but the low pulse width is normal. The second period of MCLK is reduced by ΔT, to TP−ΔT.

The third clock period is a repeat of the first clock period. LOAD_CTL is low at the rising edge of FCLK, so MCLK rising is not delayed. Then LOAD_CTL is high for the falling edge of FCLK, delaying the falling edge of MCLK. The high pulse of MCLK is extended, producing a period of TP+ΔT.

The fourth clock period is a repeat of the second clock period. LOAD_CTL is high at the rising edge of FCLK, so MCLK rising is delayed. Then LOAD_CTL is low for the falling edge of FCLK, not delaying the falling edge of MCLK. The high pulse of MCLK is reduced, producing a period of TP−ΔT.

All odd clock cycles of MCLK are extended by ΔT, while all even clock cycles are reduced by ΔT. Thus the period of modulated clock MCLK varies between TP+ΔT and TP−ΔT. The variation in clock period results in a spreading of the clock frequency over two frequencies rather than just one frequency, resulting in reduced EMI.

FIG. 5C is a table highlighting the clock modulation of FIGS. 5A,B that occurs over two cycles. In this example, the fixed clock FCLK has a frequency of 100 MHz, or a period of 10 nanoseconds (ns). This is shown by the first row of the table.

For the odd-numbered clock cycles 1, 3, 5, 7, the load is enabled by LOAD_CTL being high and turning on transistor 26 to connect capacitor 28 to VLCLK. The capacitor increases the delay by 25 picoseconds (ps) in this example, but other delays can be substituted for various designs. The clock period is extended by 25 ps to 10.025 ns, which is equivalent to a frequency decrease of 0.25%.

For the even-numbered clock cycles 2, 4, 6 the load is disabled by LOAD_CTL being low and turning off transistor 26 to disconnect capacitor 28 from VLCLK. The falling clock edge is no longer delayed by 25 ps and the high pulse width is reduced by 25 ps. The clock period is reduced by 25 ps to 9.975 ns, which is equivalent to a frequency increase of 0.25%.

Thus the clock period toggles between 10.025 and 9.975 ns over a clock modulation period of 2 cycles. The frequency of MCLK is spread by +/−0.25%. Since the MCLK frequency is spread over two frequencies, this results in a 50% reduction of the peak (un-modulated) EMI, or −3 dB.

Figure 6A:
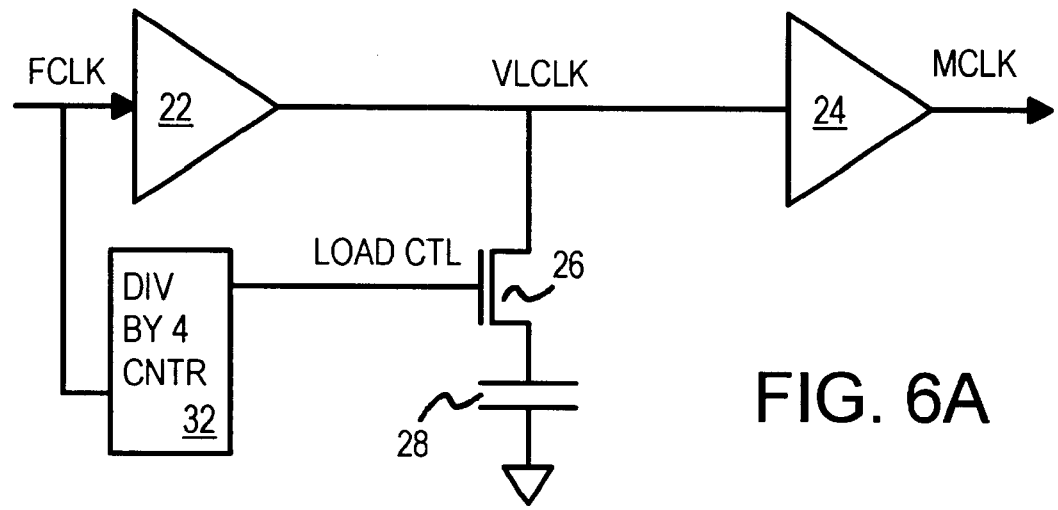
FIG. 6A shows a clock modulator that switches the load capacitor using a divide-by-four counter, which enables the load for two cycles and then disables the load for two cycles.

FIG. 6A shows a clock modulator that switches the load capacitor using a divide-by-four counter. A somewhat slower rate of switching the load may be desirable to produce a smoother frequency modulation profile. Counter 32 divides the input FCLK by four, causing LOAD_CTL to switch with a period four times that of FCLK. A ring counter, 2-bit binary or gray-code counter, or a cascaded pair of toggle flip-flops could implement counter 32, among other possible embodiments.

Load-switching transistor 26 is turned on for two cycles of FCLK, adding capacitor 28 to the load on VLCLK and delaying clock edges of MCLK. Then load-switching transistor 26 is turned off for two cycles of FCLK, disconnecting capacitor 28 from VLCLK, allowing clock edges of MCLK to be generated with low delay.

Figure 6B:
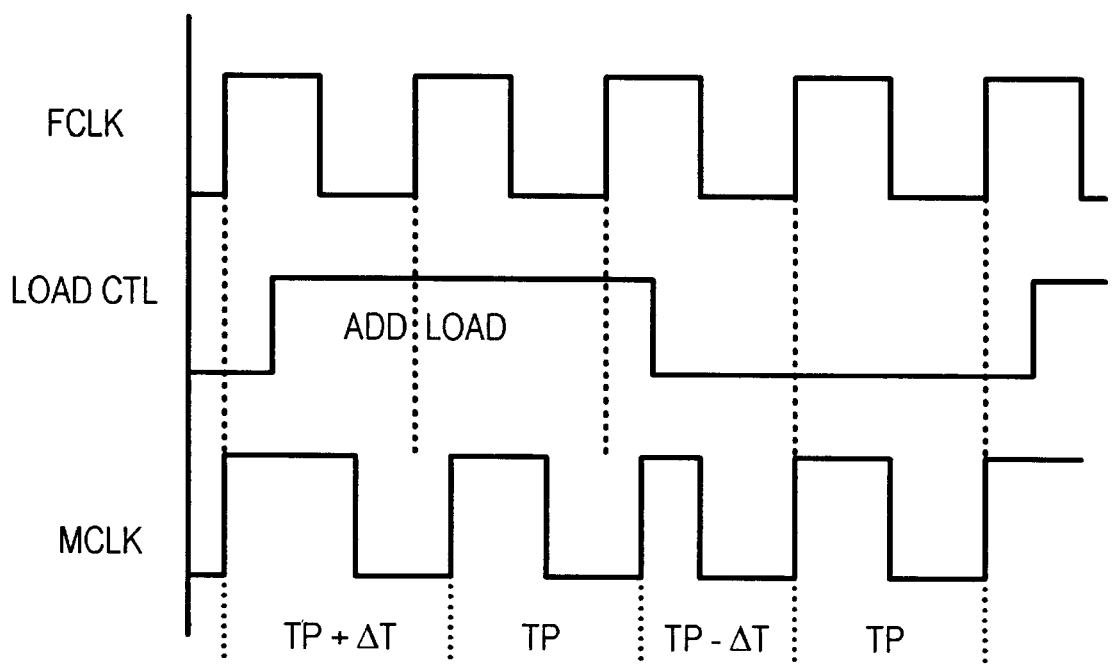
FIG. 6B is a waveform of operation of the clock modulator of FIG. 6A.

FIG. 6B is a waveform of operation of the clock modulator of FIG. 6A. The Divide-by-four counter alternately drives LOAD_CTL high for two cycles of FCLK, then low for two cycles. The extra capacitive load is added starting with the falling edge of MCLK in the first cycle, and for the next three clock edges for a total of four edges or two cycles of MCLK. Then once LOAD_CTL is low, the edges of MCLK are not delayed for four clock edges starting with the falling edge of the third cycle.

In a cycle when LOAD_CTL rises, the period of MCLK is extended by the added delay being introduced during the cycle. Thus cycles 1 and 5 have a period of TP+ΔT, as do every fourth cycle beyond (9,13, 17, etc.). In a cycle when LOAD_CTL falls, the period of MCLK is reduced by eliminating the added capacitive delay during the cycle. Thus cycle 3 has a period of TP−ΔT, as does every fourth cycle beyond (7,11, 15, etc.).

For cycles in which LOAD_CTL does not change, the delay from FCLK to MCLK does not vary. The period of MCLK is the nominal period TP. This occurs for every even cycle, such as cycles 2, 4, 6, 8, etc.

FIG. 6C is a table highlighting clock modulation over four cycles produced by the clock modulator of FIG. 6A. In this example FCLK operates at 100 MHz, with a nominal period of 10.000 ns. LOAD_CTL is high, enabling the added capacitive load, for two clock periods, and then is low for two clock periods. This pattern is repeated every four clock periods. For periods 1 and 5, the capacitor load is added in the middle of the cycles and the clock period is extended by 25 ps to 10.025 ns. For periods 3 and 7, the capacitor load is disconnected in the middle of the cycles and the clock period is reduced by 25 ps to 9.975 ns. The nominal period of 10.000 ns is produced when the load is not changed, such as for all even clock periods.

The frequency of MCLK is spread from −0.25% to +0.25%. However, the nominal frequency (+0.00%) is also produced. The clock is modulated over 3 frequencies in a clock modulation period of 4 cycles. The modulated clock has the nominal frequency for half of the time, has a frequency 0.25% lower for one-quarter of the time, and a frequency 0.25% higher for one-quarter of the time. The EMI profile has a peak at the nominal frequency that is 50% of the un-modulated EMI, with two shoulders at 25% of the un-modulated EMI. Although the same peak reduction occurs as for FIGS. 5A–C, the EMI is spread among the nominal and two shoulder frequencies. This produces a smoother EMI frequency-modulation profile.

Figure 7A:
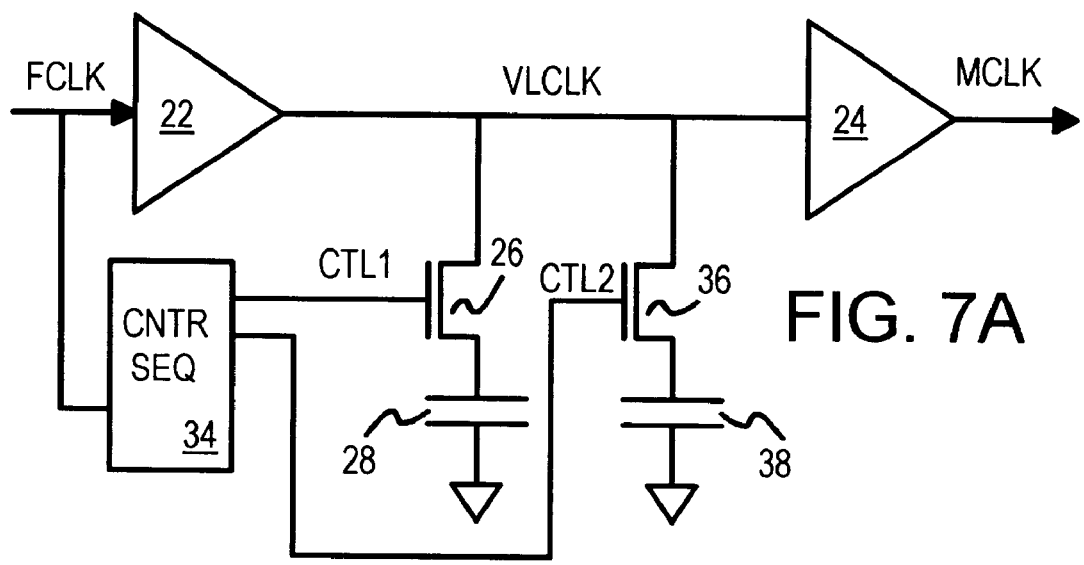
FIG. 7A is another embodiment of the clock modulator that switches two capacitive loads.

FIG. 7A is another embodiment of the clock modulator that switches two capacitive loads. Further spreading of the EMI frequency-modulation profile can be accomplished by spreading the clock modulation over more frequencies and over a larger number of clock cycles.

Two capacitor loads are separately switched by counter-sequencer 34, which is clocked by FCLK. Counter-sequencer 34 drives first control signal CTL1 to the gate of load-switching transistor 26, and second control signal CTL2 to the gate of second load-switching transistor 36. When CTL1 is high, capacitor 28 has to be charged and discharged by input buffer 22 before the logic threshold of output buffer 24 is reached, thus delaying clock edges. When CTL2 is high, capacitor 38 has to be charged and discharged by input buffer 22 before the logic threshold of output buffer 24 is reached, thus also delaying clock edges. When both CTL1 and CTL2 are high, both capacitors 28, 38 have to be charged, further delaying clock edges.

The loading of VLCLK varies among three values—no added load when CTL1,2 are both low, one added load when either (but not both) of CTL1 or CTL2 is high, and two added loads when both CTL1 and CTL2 are high. Clock edges are doubly delayed when both CTL1 and CTL2 are high, but only singly delayed when only one of CTL1, CTL2 is high.

Figure 7B:
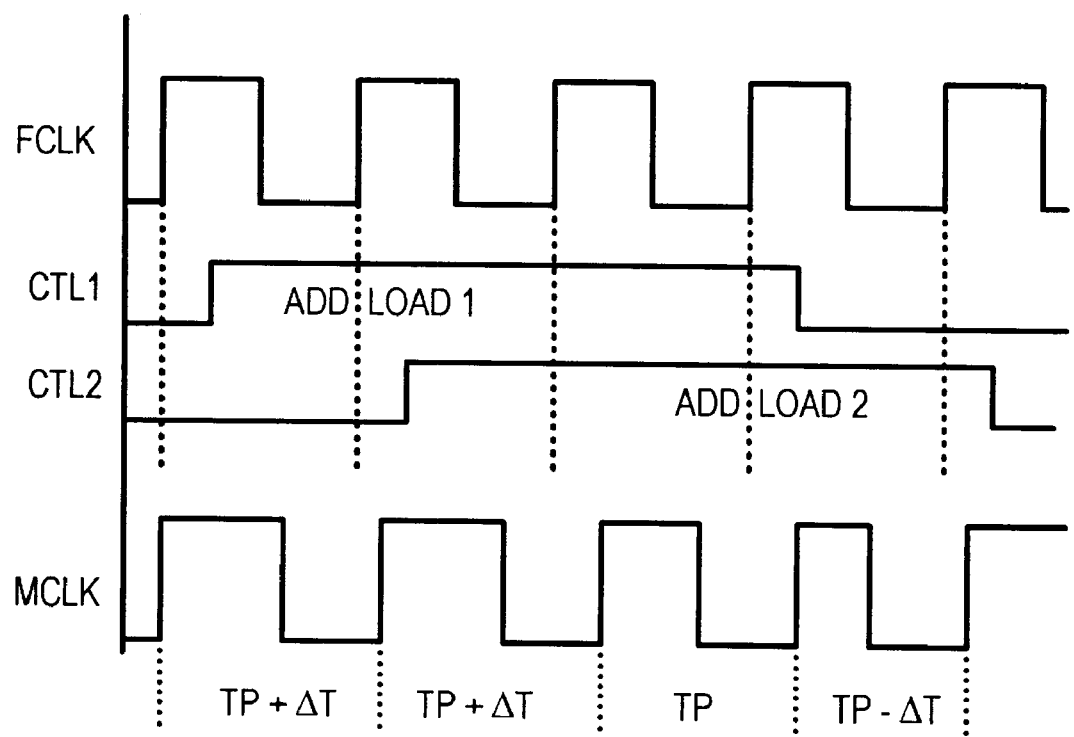
FIG. 7B is a waveform showing operation of the dual-load clock modulator of FIG. 7A.

FIG. 7B is a waveform showing operation of the dual-load clock modulator of FIG. 7A. A fairly complex sequence can be implemented by counter-sequencer 34. While a simple binary or gray-code count sequence could be used, a more complex sequence can better spread the EMI frequency-modulation profile. In FIGS. 7B, 7C, a staggered independent count sequence is generated by counter-sequencer 34. CTL1 is high for 3 cycles, then low for 3 cycles, starting with cycle 1. CTL2 is high also for 3 cycles, then low for 3 cycles, but it starting with cycle 2. Thus CTL2 is delay from CTL1 by one cycle. The full 6-cycle modulation sequence is shown in column 2 of FIG. 7C.

CTL1 goes high during cycle 1 and remains high for 3 cycles, so that edges of MCLK are delayed by the first load delay for cycles 2, 3, 4. CTL2 goes high during cycle 2 and remains high for 3 cycles, so that edges of MCLK are delayed by the second load delay for cycles 3, 4, 5. Adding the CTL1 load in cycle 1 extends the end of the first cycle by one delay, to TP+ΔT. In cycle 2, the CTL2 load is added, further delaying clock edges by a second ΔT. The start of the second cycle was already delayed by ΔT, so the period of cycle 2 is also TP+ΔT.

No additional delays are added in cycle 3, so the period is the nominal ΔT, even though the clock edges of MCLK are delayed from FCLK by 2*ΔT. In cycle 4, the CTL1 delay is removed, reducing clock-edge delays by ΔT. The period of cycle 4 is TP−ΔT. In cycle 5, the CTL2 delay is also removed, reducing clock-edge delays by another ΔT. The period of cycle 5 is TP−ΔT.

FIG. 7C is a table showing the six-clock modulation cycle of the dual-load clock modulator of FIG. 7A. In this example, capacitors 28, 38 of FIG. 7A are assumed to be equal in size, and each produce a 12 ps delay.

Initially, both CTL1 and CTL2 are off, so the nominal 10 ns (100 MHz) cycle is produced. CTL1 switches high, extending cycle 1 by 12 ps to 10.012 ns. In cycle 2 CTL2 is also switched high, causing clock edges to be delayed by an additional 12 ps, for a total of 24 ps. However, since clock edges were already delayed by 12 ps in cycle 1, the added delay in cycle 2 is only 12 ps. Cycle 2 is thus extended by 12 ps to 10.012 ns.

In cycle 3, CTL1, 2 are constant, causing no change in delay. The nominal 10 ns cycle is produced, since all clock edges in the cycle are equally delayed by 24 ps. In cycle 4 CTL1 is turned off, reducing the delay by 12 ps. Cycle 4 has a period that is reduced by 12 ps to 9.988 ns. In cycle 5 CTL2 is turned off, reducing the delay by 12 ps. Cycle 5 has a period that is also reduced by 12 ps to 9.988 ns. In cycle 6, no changes occur in CTL1,2, so the nominal cycle period of 10 ns is produced. The modulation cycle then repeats with cycle 7 being the same as cycle 1.

The frequency is equally modulated over 6 cycles between 3 frequencies: +0.12%, +0.0%, and −0.12%. The peak un-modulated EMI is reduced by 66%, for an estimated reduction of −4.7 dB.

The two load capacitors can have non-equal capacitances to further spread EMI. FIG. 8 is a table for operation of the clock modulator of FIG. 7A when capacitors 28, 38 have different capacitance values. The total delay when both capacitors 28, 38 are connected to VLCLK is 25 ps. However, capacitor 28, which is enabled by CTL1, produces a 17 ps added delay, while capacitor 38, enabled by CTL2, produces only an 8 ps delay. These delays can result when capacitor 28 is double the size of capacitor 38.

Counter-sequencer 34 is modified to produce the sequence shown in column 2 over a 7-cycle modulo. CTL1 is first switched on and off in cycles 1 and 2, then CTL2 is switched on and off in cycles 3 and 4. Finally both CTL1, CTL2 are switched on together in cycle 5, remain on in cycle 6, and are both switched off together in cycle 7. A 7-state state machine sequencer could be used to generate this sequence or another similar sequence.

The larger capacitor 28 is switched on and off in cycles 1, 2. CTL1 is first enabled in cycle 1, adding 17 ps to the period of cycle 1, to 10.017 ns. In cycle 2, CTL1 is turned off, reducing the period of cycle 2 by 17 ps to 9.983 ns.

The smaller capacitor 38 is switched on and off in cycles 3, 4. CTL2 is first enabled in cycle 3, adding 8 ps to the period of cycle 3, to 10.008 ns. In cycle 4, CTL2 is turned off, reducing the period of cycle 4 by 8 ps to 9.992 ns.

Both capacitors are switched on in cycle 5. Capacitor 28 adds 17 ps, while capacitor 38 add 8 ps, for a total added delay of 25 ps. Cycle 5 has a period that is extended to 10.025 ns. In cycle 6, no change occurs in CTL1, CTL2, so a nominal cycle of 10.000 ns occurs. Finally in cycle 7 both capacitors are disconnected, speeding up delays by 25 ps, producing a period of 9.975 ns. The 7-cycle then sequence repeats with cycle 1.

The frequency is spread over 7 cycles among 7 frequencies: +0.25%, +0.17%, +0.08%, +0.0%, −0.08%, −0.17%, and −0.25%. This frequency spreading of 0.5% reduces EMI by −8.5 dB.

When m is the number of unequal loads, the maximum number of unique frequencies is $2^{(m+1)}-1$ using this method. Greater peak EMI reduction occurs as the clock is spread among more unique frequencies.

ALTERNATE EMBODIMENTS

Several other embodiments are contemplated by the inventor. Output drivers 16 can include branching logic to generate multiple copies of MCLK that drive different parts of a system, such as a memory clock to a clocked DRAM and a processor clock to a microprocessor that are both based on the same reference clock. More complex clock-dividing and power-down clock disabling logic can be included in output drivers 16. Either inverting or non-inverting buffers can be used for the input circuit, output drivers, and buffers in the clock modulator. The sequencer can be clocked by either the rising or falling edge of FCLK, or by a derivative of FCLK. The sequencer clock and FCLK could each be derived from a common upstream input clock.

A p-channel load-switching transistor could be substituted, or both a p-channel and an n-channel transistor could be used in parallel as a transmission gate to switch the clock load on and off. Other transistors, resistors, or capacitors could be added in parallel or series to adjust the load characteristics and the switching speed.

The input buffer, clock modulator, and output buffers could be a stand-alone clock-buffer chip that generates clocks for a larger system such as a router or computer, or could be integrated together with a system or sub-system that uses the modulated clock. External EMI can still be reduced when external signals are generated from the modulated clock, even when the internal modulated clock is not driven off-chip. The input and/or output buffers could be deleted or reduced when the clock modulator is part of a larger system on a chip. The clock modulator could be replicated several times to modulate several clock signals, or the modulation control signals could be shared among several modulators. A central logic circuit can coordinate several modulators.

The input fixed clock could itself be pre-modulated by a clock-modulating PLL and be further modulated by the invention. This two-stage clock modulation could further reduce EMI. Since the invention does not require a PLL circuit to modulate EMI, a two-stage cascaded clock modulation circuit does not create additional PLL tracking jitter problems due to the pre-modulated clock circuit.

A desired frequency modulation profile can be produced by changing the number of switched loads, the size of the loads, and the time-duration or time-sequence of enabling and disabling the loads. For example, a load could be turned on slowly over more than one clock cycle so that the delay added varies for different cycles when the load is connected. The size of the load-switching transistor could be reduced to increase series resistance to the capacitor, increasing the R-C time constant to charge the load.

The delay-modulated clock modulator can be more stable than PLL-based clock generators, since no feedback is necessary. Standard logic gates can be used, so the clock modulator can be integrated onto larger logic chips. The clock generator can be cascaded with PLL-based clock generators without tracking or jitter problems. Peak EMI can be reduced as effectively as PLL-based spread-spectrum clock generators. The clock modulator can be inserted into existing chip designs and at multiple places in a large logic chip.

The examples have used a 100 MHz clock for illustration and easy comparison, but other clock frequencies could be used. A target frequency spread of 0.25% may be desired, but is not always required, since some microprocessors have a specified jitter limit of 0.50%. A 50%–50% duty cycle is not necessary. The delay to switch the capacitor on and off has been rapid in the examples, so that the capacitor is turned on before the middle (falling) edge in a clock cycle. However, the invention can be used when a longer enablement delay occurs. For example, when the capacitor does not connect until after the falling edge, but still before the next rising edge, the clock periods are still extended and reduced as shown in the tables, although the middle edge would be shifted somewhat in the timing waveforms.

For illustrative purposes the waveform diagrams have shown little or no delay when the load-switching transistor is off and the capacitor is disconnected. In actual circuits, a delay occurs from FCLK to MCLK when the load-switching transistor is off, while a larger delay occurs when the load-switching transistor is on. These actual delays can be added to the timing waveforms, but make understanding the invention more difficult. Thus the timing diagrams are somewhat idealized for simplicity.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A clock modulator for spreading a frequency spectrum of an input clock to generate an output clock with a varying frequency comprising:

an input buffer, receiving the input clock, for driving an intermediate node;

an output buffer, receiving the intermediate node, for driving the output clock;

a load capacitor;

a load switch for connecting the load capacitor to the intermediate node in response to a control signal and for disconnecting the load capacitor from the intermediate node in response to an inverse of the control signal; and a sequencer, responsive to the input clock, for sequencing the control signal through a predetermined sequence of states;

wherein a clock period of the output clock is extended when the load switch connects the load capacitor to the intermediate node in response to a change in state of the control signal;

wherein the clock period of the output clock is reduced when the load switch disconnects the load capacitor from the intermediate node in response to a change in state of the control signal, whereby frequency is modulated by extending the clock period when the load capacitor is connected, and reducing the clock period when the load capacitor is disconnected.

2. The clock modulator of claim 1 wherein the load switch is a n-channel transistor that receives the control signal at a gate, and connects to the intermediate node at a drain and connects to the load capacitor at a source;

wherein when the control signal transitions from low to high, the load switch turns on to connect the load capacitor to the intermediate node, increasing delay to the output clock, and extending the clock period;

wherein when the control signal transitions from high to low, the load switch turns off to disconnect the load capacitor to the intermediate node, decreasing delay to the output clock, and reducing the clock period.

3. The clock modulator of claim 1 wherein when the control signal does not transition, the load switch remains on or off, maintaining a constant delay to the output clock, and neither extending nor reducing the clock period;

wherein the clock period of the output clock is a nominal period when the control signal remains at a constant state.

4. The clock modulator of claim 3 wherein the input buffer is inverting or non-inverting, and wherein the output buffer is inverting or non-inverting.

5. The clock modulator of claim 1 wherein the sequencer is a toggle flip-flop that is clocked by the input clock and has an output driving the control signal, wherein alternate clock cycles of the output clock are extended in period and reduced in period over a 2-clock-cycle modulation period;

or the sequencer is a counter that is clocked by the input clock and has an output driving the control signal, the counter being a divide-by-n counter wherein n is a whole number greater than 2, wherein the output clock is modulated over a n-clock modulation period and the predetermined sequence of states comprises n states.

6. The clock modulator of claim 5 further comprising:

a second load capacitor; and a second load switch for connecting the second load capacitor to the intermediate node in response to a second control signal and for disconnecting the second load capacitor from the intermediate node in response to an inverse of the second control signal;

wherein the sequencer is a multi-bit sequencer that generates the control signal and the second control signal, whereby at least two load capacitors are switched by the sequencer to modulate delay to the output clock.

7. The clock modulator of claim 6 wherein the load capacitor and the second load capacitor have substantially a same value of capacitance.

8. The clock modulator of claim 7 wherein the predetermined sequence of states includes:

a state wherein the control signal transitions high and the second control signal does not change, extending the clock period by a first delay;

a state wherein the control signal transitions low and the second control signal does not change, reducing the clock period by the first delay;

a state wherein the second control signal transitions high and the control signal does not change, extending the clock period by the first delay;

a state wherein the second control signal transitions low and the control signal does not change, reducing the clock period by the first delay; and a state wherein the control signal does not change and the second control signal does not change, producing the clock period with a nominal period, whereby frequency of the output clock is modulated over at least 3 frequencies, a first frequency corresponding to the clock period reduced by the first delay, a second frequency corresponding to the clock period increased by the first delay, and a nominal frequency corresponding to the clock period without the first delay.

9. The clock modulator of claim 6 wherein the load capacitor and the second load capacitor have substantially different values of capacitance;

wherein connecting the load capacitor causes the output clock to be extended by a first delay;

wherein connecting the second load capacitor causes the output clock to be extended by a second delay;

wherein the first delay and second delay have substantially different values.

10. The clock modulator of claim 9 wherein the load capacitor has substantially double a value of the value of capacitance of the second load capacitor;

wherein the first delay is substantially double the second delay.

11. The clock modulator of claim 9 wherein the predetermined sequence of states comprises:

a state wherein the control signal transitions high and the second control signal does not change, extending the clock period by the first delay;

a state wherein the control signal transitions low and the second control signal does not change, reducing the clock period by the first delay;

a state wherein the second control signal transitions high and the control signal does not change, extending the clock period by the second delay;

a state wherein the second control signal transitions low and the control signal does not change, reducing the clock period by the second delay; and a state wherein the second control signal transitions low and the control signal also transitions low, reducing the clock period by the combination of the first delay and the second delay;

a state wherein the second control signal transitions high and the control signal also transitions high, extending the clock period by a combination of the first delay and the second delay;

a state wherein the control signal does not change and the second control signal does not change, producing the clock period with a nominal period;

wherein a frequency of the output clock is modulated over at least 7 frequencies, a first frequency corresponding to the clock period increased by the first delay, a second frequency corresponding to the clock period reduced by the first delay, a third frequency corresponding to the clock period increased by the second delay, a fourth frequency corresponding to the clock period reduced by the second delay, a fifth frequency corresponding to the clock period increased by a combination of the first delay and the second delay, a sixth frequency corresponding to the clock period reduced by the combination of the first delay and the second delay, and a nominal frequency corresponding to the clock period without the first delay or second delay, whereby frequency is modulated over 7 frequencies over 7 cycles.

12. The clock modulator of claim 9 wherein frequency is modulated within +/−0.25% deviation of a nominal frequency.

13. The clock modulator of claim 6 wherein the clock modulator is integrated on an integrated circuit with other logic circuits that receive the output clock and generate output signals, wherein the output signals derived from the output clock are modulated to reduced electro-magnetic interference (EMI).

14. The clock modulator of claim 6 further comprising:

a phase-locked loop (PLL) that generates the input clock to the input buffer.

15. A delay-modulated clock buffer comprising:

input buffer means, receiving an input clock, for driving an intermediate clock; output buffer means, receiving the intermediate clock, for generating an output clock that is modulated in frequency;

sequence means, operated in synchronization to the input clock, for cycling a control signal through a sequence of states; and load means for increasing a load to the intermediate clock to add a first delay to the output clock in response to a state of the control signal, and for reducing the load to the intermediate clock in response to another state of the control signal;

wherein a period of the output clock is extended during one clock cycle by the first delay when the load means increases the load;

wherein the period of the output clock is reduced during one clock cycle by the first delay when the load means reduces the load;

wherein the period of the output clock is not extended or reduced by the first delay during one clock cycle when the load means neither increases nor decreases the load, whereby periods of clock cycles are modulated by adding or reducing a delay to modulate the output clock.

16. The delay-modulated clock buffer of claim 15 wherein the load means comprises:

capacitor means for providing a load for charging and discharging by the input buffer means;

switch means, responsive to the control signal, for connecting the load to the intermediate clock and for disconnecting the load from the intermediate clock in response to states of the control signal.

17. The delay-modulated clock buffer of claim 16 wherein the switch means comprises a n-channel transistor or a p-channel transistor or a transmission gate having both an n-channel transistor and a p-channel transistor.

18. The delay-modulated clock buffer of claim 16 wherein the control signal comprises a plurality of signals, and the load means further comprises:

second capacitor means for providing a second load for charging and discharging by the input buffer means;

second switch means, responsive to the control signal, for connecting the second load to the intermediate clock and for disconnecting the second load from the intermediate clock in response to states of the control signal, whereby at least two loads are connected and disconnected to modulate the output clock.

19. A spread-spectrum clock generator comprising:

a first buffer that receives a fixed-frequency clock and drives an intermediate clock;

a second buffer that receives the intermediate clock and drives a modulated clock having a variable frequency;

a controller that changes control states in synchronization to the fixed-frequency clock;

a load capacitor that increases delay of the intermediate clock;

a switch transistor, with a gate coupled to the controller, for connecting the load capacitor to the intermediate clock in response to a first control state, and for disconnecting the load capacitor from the intermediate clock in response to a second control state;

wherein a clock period of the modulated clock is extended when the switch transistor connects the load capacitor to the intermediate clock in response to a change to the first control state by the controller;

wherein a clock period of the modulated clock is reduced when the switch transistor disconnects the load capacitor from the intermediate clock in response to a change to the second control state by the controller, wherein the clock periods of the modulated clock are modulated to reduce electro-magnetic interference (EMI) from the modulated clock or signals generated from the modulated clock.

20. The spread-spectrum clock generator of claim 19 further comprising:

a second load capacitor that increases delay of the intermediate clock;

a second switch transistor, with a gate coupled to the controller, for connecting the second load capacitor to the intermediate clock in response to a third control state, and for disconnecting the second load capacitor from the intermediate clock in response to a fourth control state;

wherein a clock period of the modulated clock is extended when the second switch transistor connects the second load capacitor to the intermediate clock in response to a change to the third control state by the controller;

wherein a clock period of the modulated clock is reduced when the second switch transistor disconnects the second load capacitor from the intermediate clock in response to a change to the fourth control state by the controller.

* * * * *